United States Patent
Chokshi et al.

(10) Patent No.: US 6,648,730 B1
(45) Date of Patent: Nov. 18, 2003

(54) CALIBRATION TOOL

(75) Inventors: Himanshu J. Chokshi, Fremont, CA (US); Bharat Patel, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 129 days.

(21) Appl. No.: 09/703,061

(22) Filed: Oct. 30, 2000

(51) Int. Cl.⁷ .............................................. B24B 49/00
(52) U.S. Cl. .......................... 451/6; 451/42; 451/384; 382/141; 382/202; 250/491.1; 250/206.1; 250/222
(58) Field of Search .......................... 451/5, 6, 28, 42, 451/384, 460; 382/202, 141, 145, 194; 250/491.1, 206.1, 222

(56) References Cited

U.S. PATENT DOCUMENTS

| | | | |
|---|---|---|---|
| 5,012,574 A | * 5/1991 | Pryor ........................... 29/557 |
| 5,479,252 A | 12/1995 | Worster et al. .............. 356/237 |
| 5,483,138 A | 1/1996 | Shmookler et al. .... 318/568.16 |
| 5,563,798 A | 10/1996 | Berken et al. .......... 364/478.06 |
| 5,699,447 A | 12/1997 | Alumot et al. ............... 382/145 |
| 5,717,785 A | * 2/1998 | Silver .......................... 382/151 |
| 5,738,574 A | 4/1998 | Tolles et al. ................. 451/288 |
| 5,808,744 A | * 9/1998 | Moriya ................... 250/559.39 |
| 5,889,593 A | 3/1999 | Bareket ....................... 356/445 |
| 5,953,447 A | * 9/1999 | Jin ............................ 250/559.3 |
| 5,995,647 A | * 11/1999 | Hamada ...................... 250/310 |
| 6,012,775 A | * 1/2000 | Czarnecki ............. 297/344.13 |
| 6,012,965 A | * 1/2000 | Savoie ......................... 451/384 |
| 6,016,358 A | * 1/2000 | Balamurugan ................ 348/87 |
| 6,068,539 A | * 5/2000 | Bajaj et al. ...................... 451/6 |
| 6,086,453 A | * 7/2000 | Fukuoka et al. ................ 451/5 |
| 6,135,854 A | * 10/2000 | Masumura et al. .......... 451/291 |
| 6,406,834 B1 | * 6/2002 | Kuit et al. ................... 430/311 |
| 6,477,265 B1 | * 11/2002 | Sheng ......................... 382/145 |

* cited by examiner

Primary Examiner—Joseph J. Hail, III
Assistant Examiner—Anthony Ojini
(74) Attorney, Agent, or Firm—Moser, Patterson & Sheridan

(57) ABSTRACT

Generally a method and apparatus for determining a position of an object is provided. In one embodiment, an apparatus includes a locating plate, a window and a camera. The camera is positioned to view the target through the window disposed in the locating plate. The position of an object viewed by the camera through the window may be resolved relative to the position of the locating plate. In other embodiments, the apparatus may be disposed in a processing system such as a chemical mechanical polisher to align components such as robots, load cups and polishing heads.

34 Claims, 6 Drawing Sheets

CALIBRATION TOOL

BACKGROUND OF THE DISCLOSURE

1. Field of the Invention

The embodiments of the present invention relate generally to a calibration tool and a method for determining the position of an object.

2. Background of the Invention

The use of robots in automated processing systems has become increasingly popular. Robots can often perform repeated tasks with the precision and efficiency generally not achievable through the use of human labor. Moreover, robots can be used in locations where the proximity to moving components or hazardous materials makes the use of human labor in such locations undesirable.

Typically, when power is first supplied to a robot that performs complex or precision movements, the robot must establish one or more reference points or coordinates in each axis through which the robot travels. The establishment of these reference coordinates is commonly called homing. For example, a robot may be homed by jogging the robot, either manually or using an automated sequence, to a reference point. Arrival of the robot at the reference point may be confirmed by manually observing the robots end effector's position, or by having the effectuator (or other component of the robot) trigger a sensor, such as a limit switch. This sequence is typically repeated until all the reference coordinates for each axis of the robot's motion has been established (i.e., entered into the robot's or robot controller's memory).

Once the reference coordinates have been established, the robot can determine the precise location of the effectuator by referencing the position of the effectuator against the reference coordinates. For example, a stepper motor that provides motion to one axis of the robot may be coupled to an encoder that counts the number of shaft revolutions of the motor. Each shaft revolution is equated to a distance moved by the effectuator. As the controller keeps track of the distance moved as indicated by the controller against the reference coordinated, the precise location of the effectuator may be maintained by the controller. Thus, if the effectuator is to be moved a certain distance from its current position, the controller can signal the motor to rotate a prescribed number of revolutions that can be confirmed by the encoder as part of an open or closed loop system.

FIG. 1 depicts a simplified schematic of a front end 100 of a semiconductor processing system that provides an illustrative example of a robot that requires precise movements to prevent damage to a workpiece. The front end 100 generally includes one or more semiconductor storage cassettes 102 that facilitate the storage of a plurality of substrates, such as semiconductor wafers 112. Typically, the wafer storage cassette 102 includes a housing 104 having at least one open end 116 through which wafers 112 may be transferred into and out of the storage cassette 102. Inside the storage cassette 102 are a plurality of rails 114 are spaced to create a plurality of slots 106. Each slot 106 receives a respective wafer 112.

Typically, a wafer handling mechanism, for example a wafer transfer robot 122, is used to transfer the semiconductor wafers 112 from the wafer storage cassette 102 to the other components of the wafer processing system. Typically, the transfer robot 122 comprises a transfer arm 124 having an end effector or gripper 126 disposed at the end of the transfer arm 124. The gripper 126 may be a wand or an edge clamp that secures the wafer 112 to the robot 122 during the transfer of the wafer. Generally, the gripper 126 of the wafer transfer robot 122 is inserted into the wafer storage cassette 102 to retrieve one of the wafers 112 disposed therein. In order to insure accurate positioning in the gripper 126 (and wafers 112) within the cassette 102, the location of the gripper 126 relative to the cassette 102 is recorded in the robot's memory when the gripper 126 is in a predetermined position within the cassette 102. An example of such a position is a position that aligns with the center of the wafer 112 when the wafer is properly positioned within the cassette 102.

If the position is recorded incorrectly, the robot 122 may be misaligned with a wafer when transferred to other components of the system or deposit a wafer in a misaligned position relative to the wafer storage cassette 102 as depicted in FIG. 1 by wafer 118. The misaligned wafer 118 may become damaged or damage other wafers. For example, a wafer 120 disposed on the gripper 126 of the transfer robot 122 may come in contact with the misaligned wafer 118 during movement of the wafer 120 that is secured to the robot 122. If the wafers 118, 120 contact one another, one or both of the wafers may become damaged. Moreover, one or both of the wafers 118, 120 may become dislodged. A dislodged or fallen wafer typically requires an operator to shut down the system and remove the wafer before further processing can occur.

Typically, homing of the robot's gripper in a wafer storage cassette is done manually. An operator must observe the location of the gripper within the cassette to visually estimate the correct position of the gripper. In order to access the cassette when performing this task, the operator is in a position exposed to the range of motion of the robot. Thus, to prevent possible injury to the operator, the processing system is normally shut down so that robot does not inadvertently make contact with the operator, possibly damaging product, tooling or the operator. During periods where the system is shut down, no wafers are processed and valuable production time is lost.

Therefore, a need exists for an improved calibration and method for determining the position of an object.

SUMMARY OF THE INVENTION

One aspect of the present invention generally provides an apparatus for determining a position of an object. In one embodiment, an apparatus for determining a position of an object includes a locating plate, a window and a camera. The camera is positioned to view a target through the window disposed in the locating plate. The object on which the target is disposed may be viewed by the camera enabling the relative position between the locating plate and the object to be determined. In another embodiment, the image produced by the camera is viewed on a display remotely located from the apparatus.

In another aspect of the invention, a system for determining a position of an object is provided. In one embodiment, the system includes a target disposed on the object and a portable tool. The tool includes a locating plate coupled to a housing. A window is disposed in the locating plate or the housing and has an indicia disposed thereon. A camera is disposed between the housing and the locating plate. The camera positioned to view the target through the window.

In another aspect of the invention, a method for determining a position is provided. In one embodiment, the method includes the steps of locating a calibration tool in a predefined position, viewing an object thought a window disposed in the calibration tool, and determining the relative position between an indicia disposed on the window and the object.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention generally provides a calibration tool for determining the position of an object. The invention is illustratively described below with reference to determining the position of a robot's end effector relative to a substrate storage cassette and aligning components within a chemical mechanical polishing system. However, it should be understood that the invention has utility in other semiconductor processing system configurations, such as physical vapor deposition systems, chemical vapor deposition systems, etch systems, ion implant systems and any other systems, including those outside of the realm of semiconductor processing, in which the precise determination of a position of an object is desired.

Figure 1:
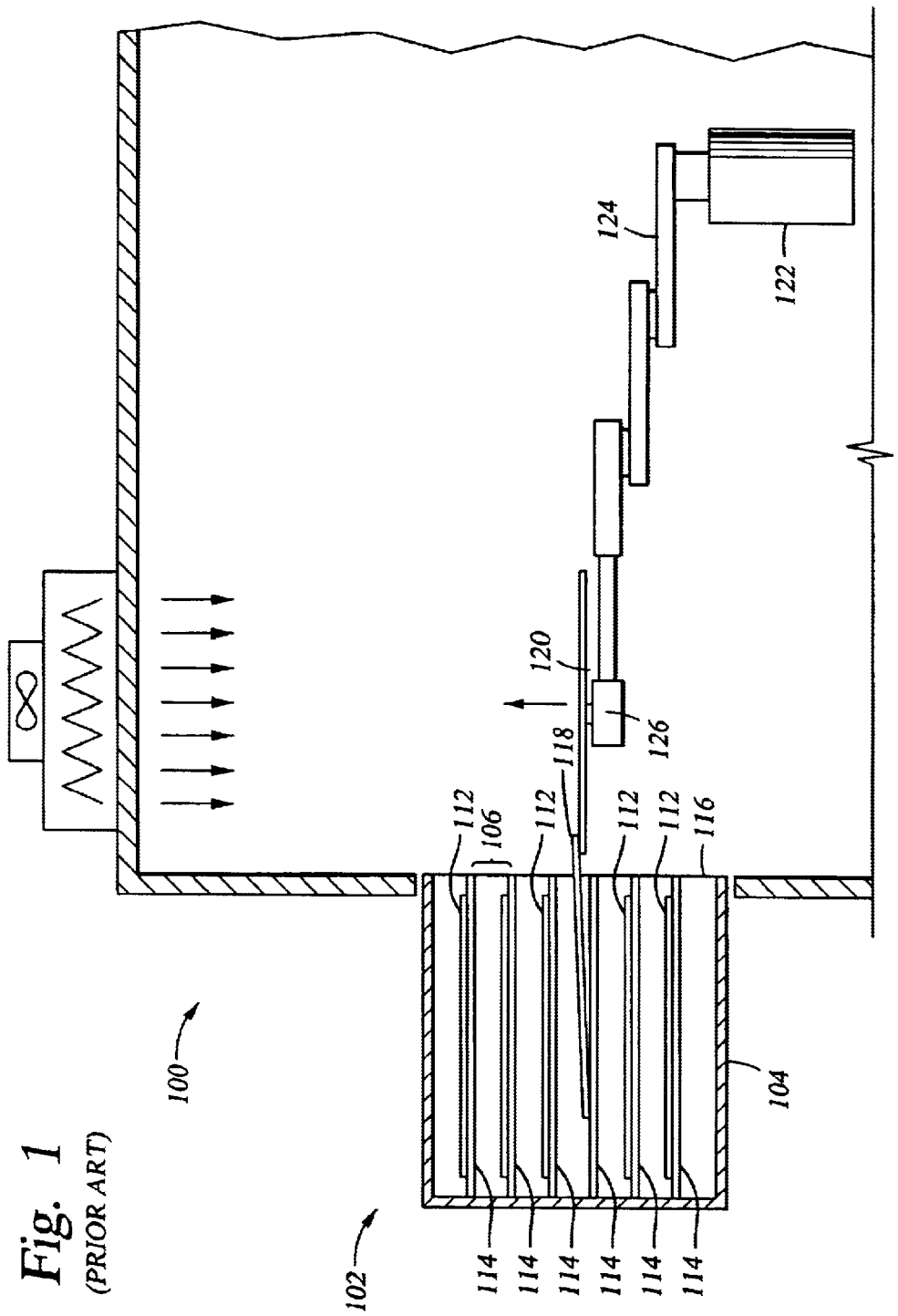
FIG. 1 (Prior Art) depicts a wafer storage cassette and a wafer transfer robot illustrating one mode of wafer damage due to poor calibration of the transfer robot.
Figure 2:
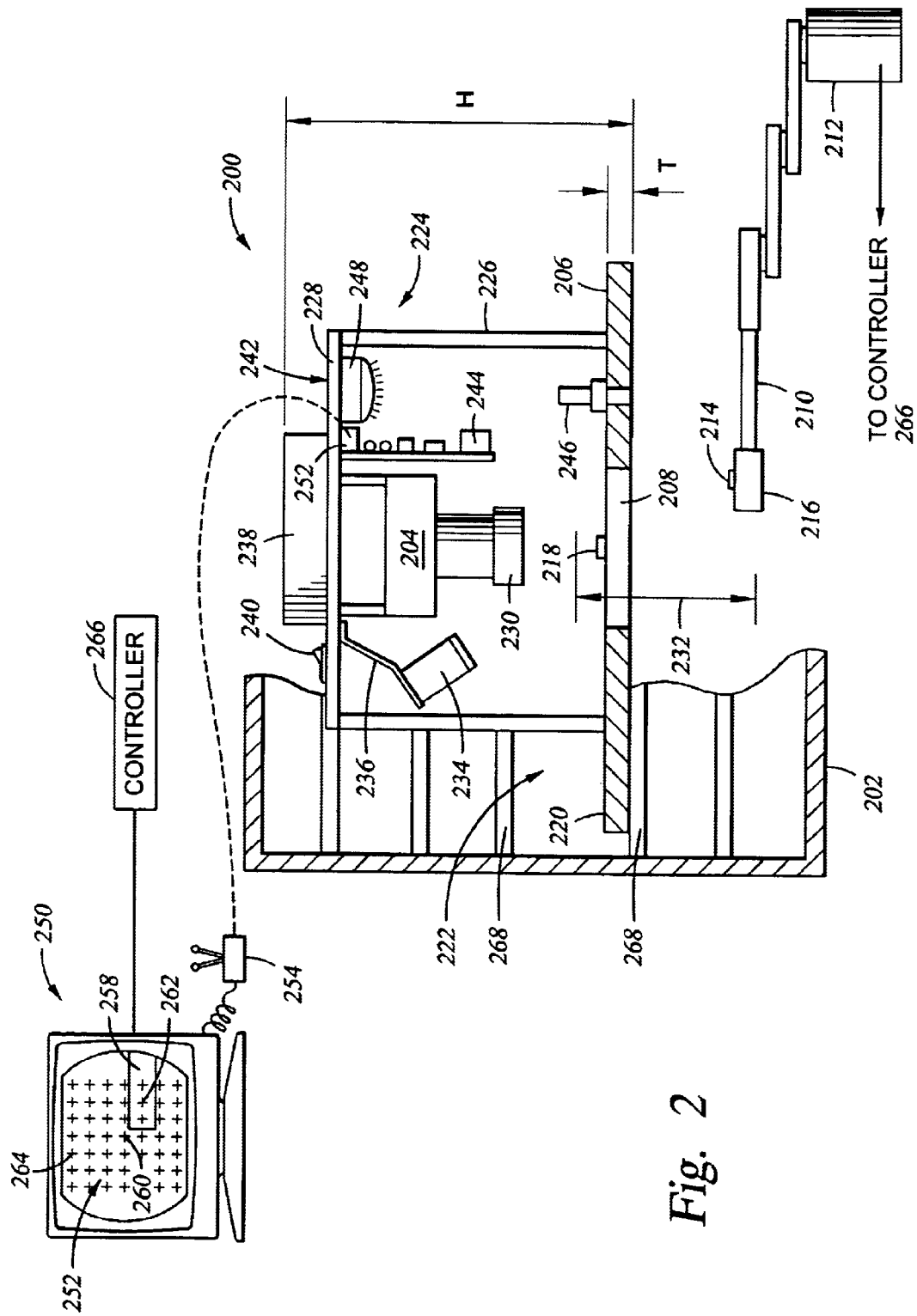
FIG. 2 is a sectional view of one embodiment of a calibration tool disposed in a substrate storage cassette.

FIG. 2 depicts a calibration tool 200 disposed in a substrate storage cassette 202. The calibration tool 200 generally comprises a camera 204 and locating plate 206. The locating plate 206 includes a window 208 disposed therein. The camera 204 views an object, such as an end effector 210 of a robot 212, through the window 208 to obtain a image that depicts the position of the end effector 210 relative to the locating plate 206. To aid in the resolution of the effector's position, a target 214 is marked or otherwise projected upon the effector 210. Alternatively, the target 214 may be disposed on a removable sheath 216 that is placed over the tip of the end effector 210.

The window 208 may comprise a portion of the locating plate 206, material such as acrylic, quartz or polycarbonate. The window 208 may comprise a portion of the locating plate 206, or comprise the entire locating plate.

The locating plate 206 generally includes an indicia 218 that is disposed on the window 208. The indicia 218 provides a "cross-hair" for the camera 204 as the camera 204 views through the window 208. The indicia 218 may be a circle, cross or other mark suitable for delineating a point of reference. The locating plate 206 is typically comprised of aluminum, stainless steel, plastic or other rigid material. The locating plate 206 is configured to position the tool 200 in a predetermined position relative to another object, for example, the substrate storage cassette 202. In one embodiment, the locating plate 206 includes a flange 220 disposed at least partially along the perimeter of the locating plate 206. At least a portion of the flange 220 has a radius configured to replicate (i.e., is substantially identical to) a substrate. The flange 220 may alternatively be a ring having an outside diameter equivalent to the diameter of the substrate for which the cassette 202 is designed. The locating plate 206 may alternative include other means for positional orientation relative to the cassette 202, such as slots, holes, pins, mating geometry, stepped surfaces and the like.

For example, when the calibration tool 200 is positioned in the substrate storage cassette 202, at least a portion of the flange 220 has a radius equivalent to a radius of the substrate (i.e., the flange has a 200 mm radius for use in systems configured for 200 mm substrates and so forth). The mounting flange 220 of the calibration tool 200 interfaces with one of a plurality of wafer receiving slots 222 defined between rails 268 disposed within the substrate storage cassette 202 positioning the mounting flange 220 as if it was a substrate. Generally, the tool 200 is positioned such that the indicia 218 disposed in the mounting flange 220 is in a position concentric with the substrates (when the substrates are loaded in the cassette).

A housing 224 is mounted to the locating plate 206. The housing 224 includes sides 226 and cover 228. The sides 226 and cover 228 may comprise a polymer or metal, such as anodized aluminum. In one embodiment, the sides 226 of the housing 224 are coupled to the locating plate 206 inward of the flange 220.

The camera 204, for example a monochrome board mounted camera available from Edmund Industrial Optics, of Barrington, N.J., is typically coupled by a plurality of stand-offs to the center of the cover 228 above the window 208. Alternatively, the camera 204 may be located in other positions within the tool 200, for example, coupled to the locating plate 206. The camera 204 is provided with a lens 230. The lens 230 is selected to have a depth of field 232 such that the indicia 218 is in focus. Additionally, the depth of field 232 should allow for the end effector 210 to be in focus at a reasonable distance from the window 208. In one embodiment, the lens 230 is a 8.5 mm focal length lens also available from Edmund Industrial Optics.

A light 234 is disposed within the housing 224 and illuminates the window 208 and indicia 218. The light 234 is typically mounted to the cover 228 by a bracket 236. The bracket 236 positions the light 234 to the side of the camera 204 and at an angle that allows the beam generated by the light 234 to additionally illuminate the end effector 210 when in a position reasonably proximate the window 208.

The light 234 is typically coupled to a power source 238. The power source 238 may be remote such as facility power or self-contained on the tool 200 such as a battery. A switch 240 is disposed on an exterior side 242 of the cover 228 to allow the light 234 to be activated. The switch 240 may alternatively be remotely operated or disposed remote from the tool 200, such as being a disposed in the controller 266. In one embodiment, the power source 238 is a battery disposed on the exterior side 242 of the cover 228.

To prevent inefficient use of the battery's power, a circuit-opening device 244 is disposed between the battery 238 and the light 234. The circuit-opening device 244 is generally coupled to the cover 228 inside of the housing 224. It should be noted that any one or all of the components mounted to the cover 228 may alternatively be coupled to the locating plate 206 or sides 226 of the housing 224. In one embodiment, the circuit-opening device 244 is a board mounted timer. Alternatively, the circuit-opening device 224 may be a relay, a solid state timing device (i.e., a timer) that may have integral controls or be controlled remotely, such as by software, a programmable controller (PLC) or a system controller 266. Since the circuit-opening device 244 effectively turns off the calibration tool 200 after use, the tool can be retrieved from the cassette 202 at the leisure of the operator while the robot draws substrates from adjoining cassettes not shown. This allows for a processing system utilizing multiple cassettes to perform calibration of the robot while minimizing the effect on product through-put.

Information regarding the vertical proximity of the end effector 210 to the locating plate 206 is provided by a sensor 246. In one embodiment, the sensor 246 is a proximity switch mounted to the locating plate 206. The sensor 246 may be a mechanical limit switch, an optical device, a proximity detector or other object detection device.

When the end effector 210 is disposed a predetermined distance from the locating plate 206, the sensor 246 generates a signal indicative of the position of the end effector 210. For example, at the predetermined distance from the locating plate 206, the proximity of the end effector 210 to the sensor 246 causes the sensor 246 to provide a signal that triggers an indicator 248. The indicator 248 may be an audio indicator, a visual indicator or a virtual switch such as an "internal coil" in a software program or PLC. In one embodiment, the indicator 248 is an audible alarm coupled to the cover 228. Alternatively, other indicators may be utilized such as indicator lights, remote displays, communication to the controller 266 or other device, text messages and the like.

A display 250 is provided to view the image 252 generated by the camera 204. The display 250 may be part of the controller 266 coupled to a system interfacing with the substrate storage cassette 202 directly or remotely to the calibration tool 200. The display 250 may receive the image 252 from the camera 204 via a cable or broadcast signal (e.g., wireless signal). In one embodiment, the display 250 is coupled to a receiver 254 that receives a signal from a transmitter 256 that is coupled to the camera 204. Typically, the transmitter 256 is located within the housing 224 and broadcasts the signal to the receiver 254.

One mode of operation for one embodiment of the calibration tool 200 is provided for illustration. The calibration tool 200 is switched on and disposed in the substrate storage cassette 202. The cassette 202 is disposed in a predetermined position that allows repeatable access by the robot 212. The coordinate reference system is then established by jogging the end effector 210 of the robot 212 into the cassette 202 proximate the bottom of the locating plate 206.

The camera 204 provides an image 258 of the target 214 disposed on the end effector 210 on the display 250. If the image 258 of the target 214 is not in focus, the end effector 210 may be jogged closer to the locating plate 206 until the target 214 is within the depth of field 232 of the lens 230 and in focus on the display 250. As the view of the camera 204 is through the window 208, an image 260 of the indicia 218 is also shown on the display 250.

The x/y position of the end effector 210 relative to the indicia 218 is viewed on the display 250. The end effector 210 may be jogged along either axis until the images indicia 260 and target 262 align. The jogging sequence may be done "by eye" or by proving commands to the robot's controller to move discrete distances. To facilitate the distance needed to move the end effector 210, the display 250 may optionally project a grid 264 on the display. The grid 264 is configured to allow the distance between the target's image 262 and the indicia=3 s image 260 to be resolved by counting the number of grid lines between the target's image 262 and the indicia's image 260 along each axis.

Optionally, the controller 266 may process the digital misalignment between the target's image 262 and indicia's image 260 and resolve the necessary movements required to align the target 220 and indicia 218. Additionally, the controller 266 may additionally control the movement of the robot 212 in a closed-loop system. A closed-looped system may optionally be controlled completely by software, thus eliminating the need for a display 250.

Figure 3:
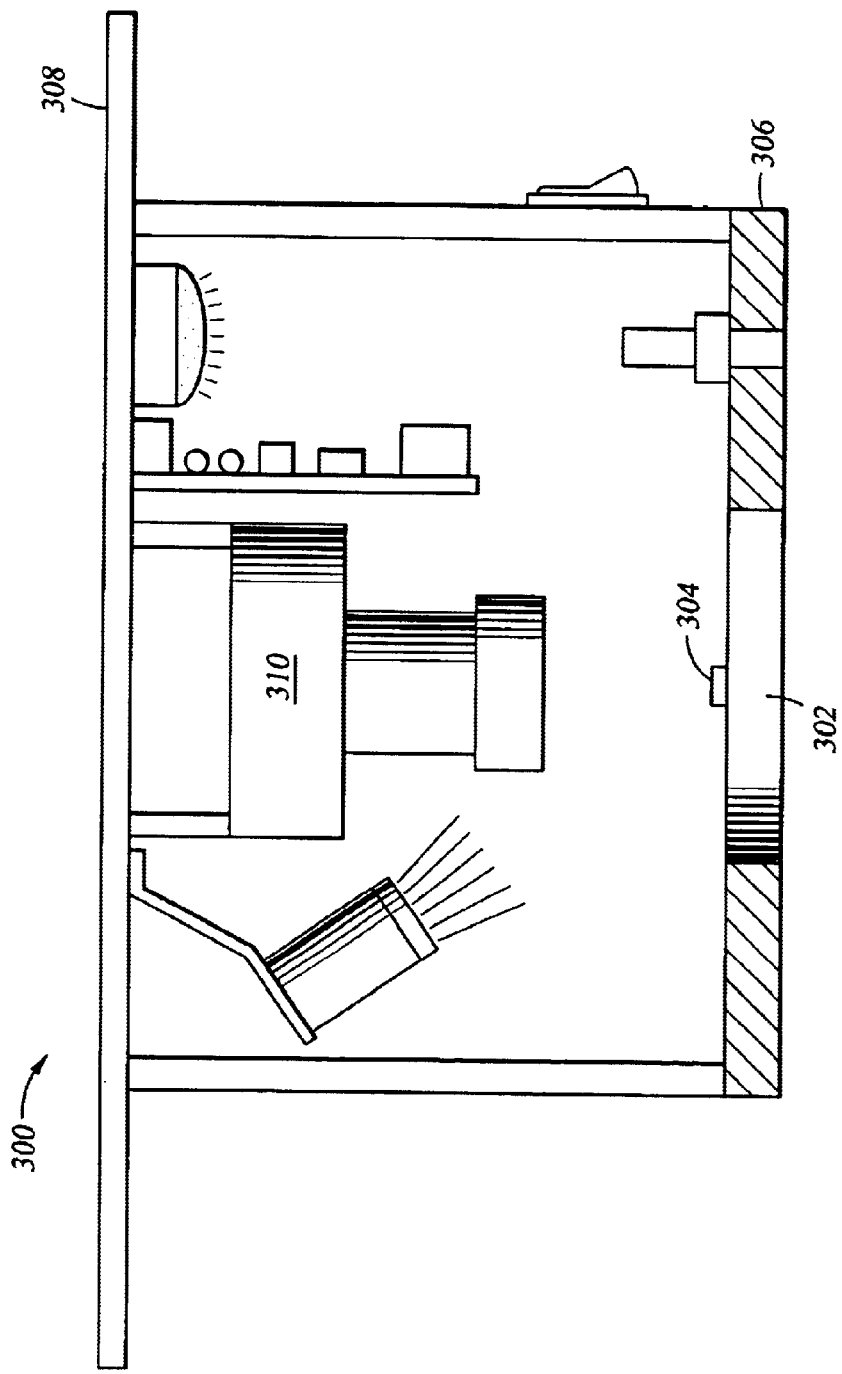
FIG. 3 is a sectional view of another embodiment of a calibration tool.

FIG. 3 depicts another embodiment of a calibration tool 300. The tool 300 is substantially similar to the calibration tool 200 described in reference to FIG. 2 except a window 302 having an indicia 304 is disposed in the cover 306 of the tool 300. A locating plate 308 of the tool 300 is disposed opposite the cover 306 allowing objects to be seen by a camera 310 disposed within the tool 300 on the side of the tool 300 opposite the locating plate 308.

Figure 4:
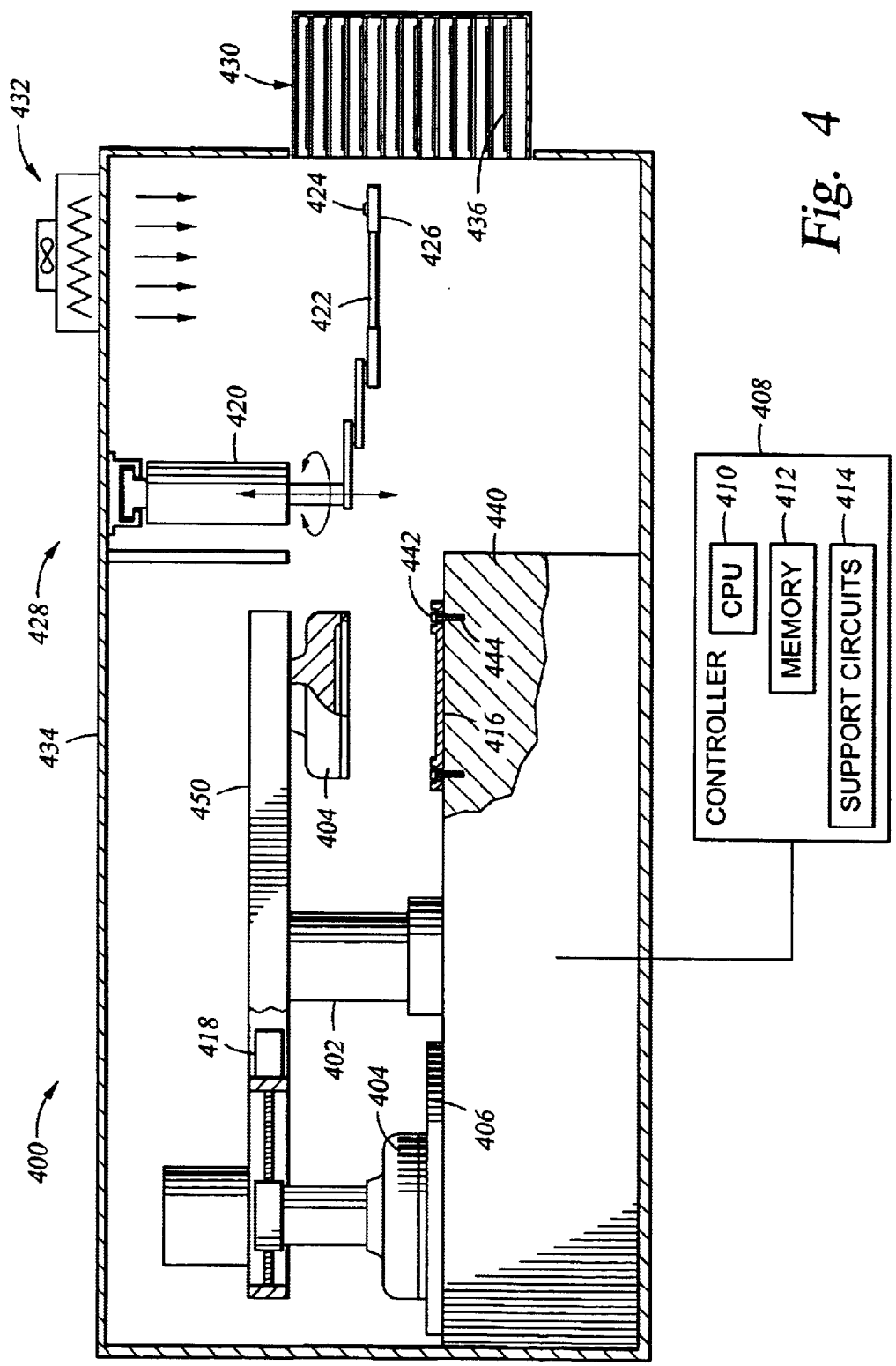
FIG. 4 depicts an elevation of one embodiment of a polisher in which the calibration tool of FIG. 3 may be utilized.

FIG. 4 depicts an elevation of an example of a chemical mechanical planarization polisher 400 in which the tool 300 may be utilized. One polisher 400 in which the invention may be utilized is a Mirra® chemical mechanical polisher, available from Applied Materials, Inc., of Santa Clara, Calif. The exemplary polisher 400 generally comprises a carousel 402 supporting one or more polishing heads 404, one or more polishing platens 406 (one is shown), and at least one load cup 416. A controller 408. is provided to facilitate control of the polisher 400. The controller 408 comprises a central processing unit (CPU) 410, a memory 412, and support circuits 414. The controller 408 is coupled to the various components of the polisher 400 to facilitate control of, for example, the transfer of a substrate between a loading robot 404 and the load cup 416.

The carousel 402 is generally described in U.S. Pat. No. 5,738,574, issued Apr. 15, 1998 to Tolles, which is hereby incorporated herein by reference in its entirety. Generally, the carousel 402 is centrally disposed on a base 440 of the polisher 400. The carousel 402 typically includes a plurality of arms 450, each arm supporting one of the polishing heads 404. The carousel 402 is indexable such that the polishing heads 404 may be moved between the polishing platens 406 and the load cup 416.

The polishing head 404 may be a TITAN II wafer carrier available from Applied Materials, Inc., of Santa Clara, Calif. The polishing head 404 generally retains a substrate against the platen 406 during polishing. Typically, the polishing head 404 is coupled to the arm 450 of the carousel 402 by a drive system 418. The drive system 418 generally provides motion to the polishing head 404 radially along the arm 450 of the carousel 402. The controller 408 controls the drive system 418.

Optionally, the polishing head 404 may be supported by a drive system that is coupled to the base of the polisher. Such a drive system typically provides an x/y motion to the polishing head relative to a stationary platen. One system that provides such a drive system is a FLATLAND® chemical mechanical polishing system, available from Applied Materials, Inc., of Santa Clara, Calif.

The load cup 416 generally moves vertically to interface with the polishing head 404 while transferring the substrate therebetween. As the positional accuracy between the load cup 416 and polishing head 404 is critical to avoid damage to the substrate during transfer, in one embodiment the load cup 418 includes oversized holes 444 that allow the load cup to move about mounting screws 442 disposed through the holes 444. The clearance around the screws 442 allows the load cup 416 to be adjusted on the base 440 so that the load cup can be aligned with the polishing head 404. Alternatively, the software controlling the drive system 418 may adjust the position of the polishing head 404 along the arm 450 of the carousel 402 or the angular rotation of the carousel 402 to provide alignment between the load cup 416 and polishing head 404.

A loading robot 420 is generally positioned proximate a factory interface (not shown) and the load cup 416 such that the range of motion provided by the robot 420 facilitates transfer of the substrates therebetween. The loading robot 420 may be any one of a number of robots having the range of motion that facilitates substrate transfer between the factory interface and the load cup 416. An example of a loading robot 420 is a 4-Link robot, manufactured by Kensington Laboratories, Inc., located in Richmond, Calif.

In one embodiment, the loading robot 420 includes an end effector 422, such as a vacuum gripper, that secures the substrate thereto during substrate transfer. The end effector 422 may include a target 424 disposed thereon. Alternatively, the target 424 may be disposed on a removable sheath 426 that covers the end effector 422. The target 424 provides a reference point on the robot 420 that is used to determine the position of the end effector 422.

Figure 5:
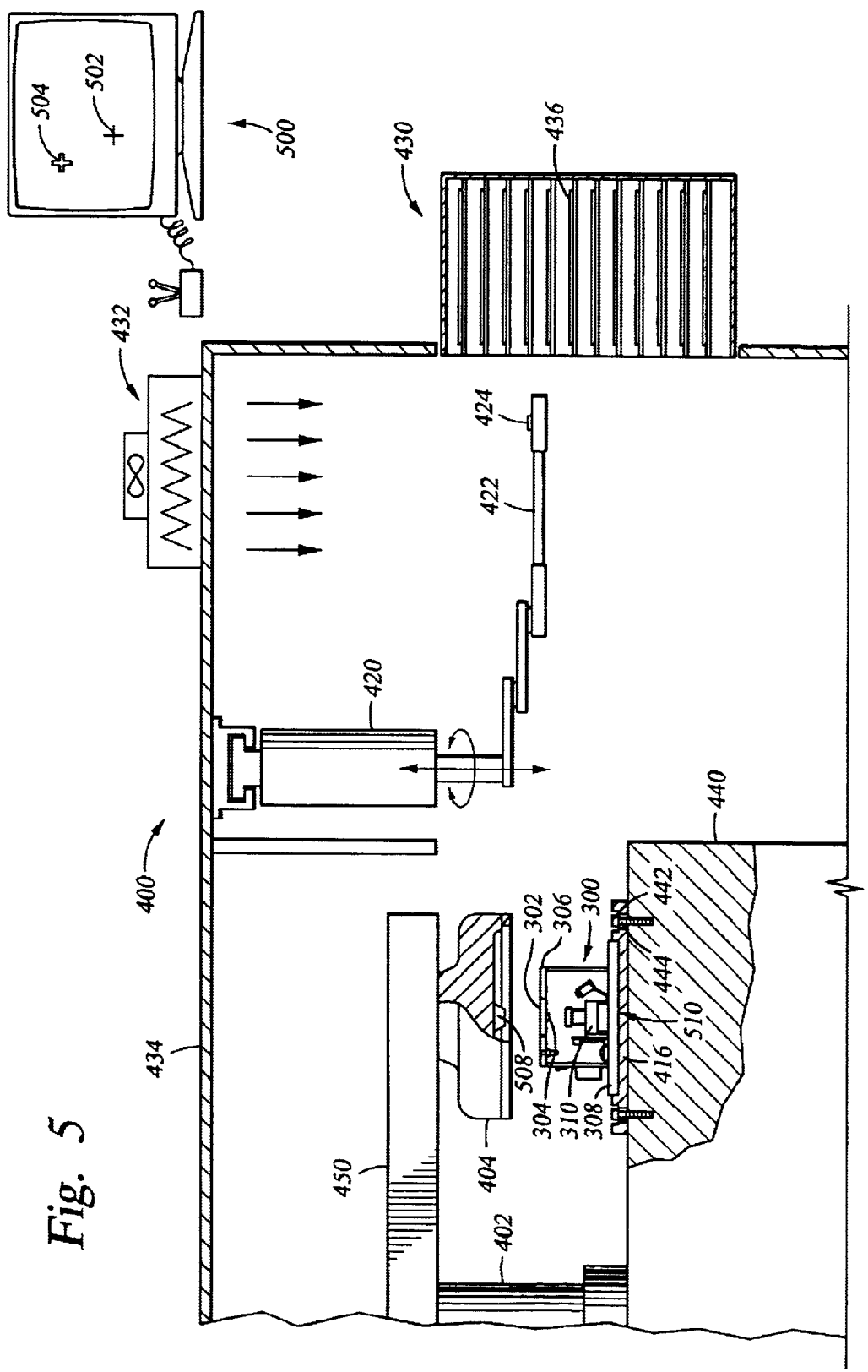
FIG. 5 depicts one mode of operation of the calibration tool of FIG. 3.

FIG. 5 depicts an example of one mode of operation in which the tool 300 may be utilized on the polisher 400 to align the load cup 416 and the polishing head 404. Generally during the alignment process, the tool 300 is secured to a tool receiving surface 510 disposed on the polishing head 404. Alternatively, the tool receiving surface 510 may be disposed on the arm 450 of the carousel 402 so that the tool 300 may be mounted thereto in lieu of the polishing head 404. The load cup 416 may contain a target 506 disposed thereon, or retain the target may be disposed on a dummy wafer retained by the load cup.

In one embodiment, the locating plate 308 is disposed against the tool receiving surface 510 that is disposed in the polishing head 404. As the locating plate 308 simulates a substrate, the locating plate 308 positions the tool 300 relative the polishing head 404 as if it was the substrate. The camera 310, facing downward from the locating plate 308, views the target 506 through the window 302 disposed in the cover 306. As the carousel 402 moves the polishing head 404 into position over the load cup 416, the camera 310 provides an image 502 of the indicia 304 and an image 504 of the target 506 on the display 500. If the indicia's image 502 and target's image 504 are not aligned, the polishing head 404 and load cup 416 are moved relative each other until the image 502 of the indicia 304 and the image 504 of the target 506 align.

In one mode of operation, the mounting screws 442 securing the load cup 416 to the base 440 of the polisher 400 may be loosened to allow the load cup 416 to move laterally relative to the base 440. The load cup 416 is moved until the images of indicia 502 and target 504 align, then the screws 442 are tightened to hold the load cup 416 in place.

In another mode of operation, the software controlling the position of the polishing head 404 is adjusted via operator input or an automated closed loop. Optionally, the position of the polishing head 404 may be adjusted by mechanical means such as adjustable stops, stroke adjustments, adjustment screws and the like.

In another mode of operation, the tool 300, when disposed in either the polishing head 404, the carousel 402 or the load cup 416, may be utilized to align (i.e., set the positional reference point) the loading robot 420 to the load cup 416. Generally, the tool 300 is mounted to the polisher 400, for example, in any of the conventions described above with reference to FIGS. 4 and 5. The target 424 disposed in the end effector 422 is moved so that the target may be viewed by the camera 310 and projected as an image on the display 500. Thus, the relative position of the end effector 422 to the indicia 304 of the tool held by the polishing head 404 (or other component having the tool positioned therein) may be determined as described with reference to FIG. 2.

Figure 6:
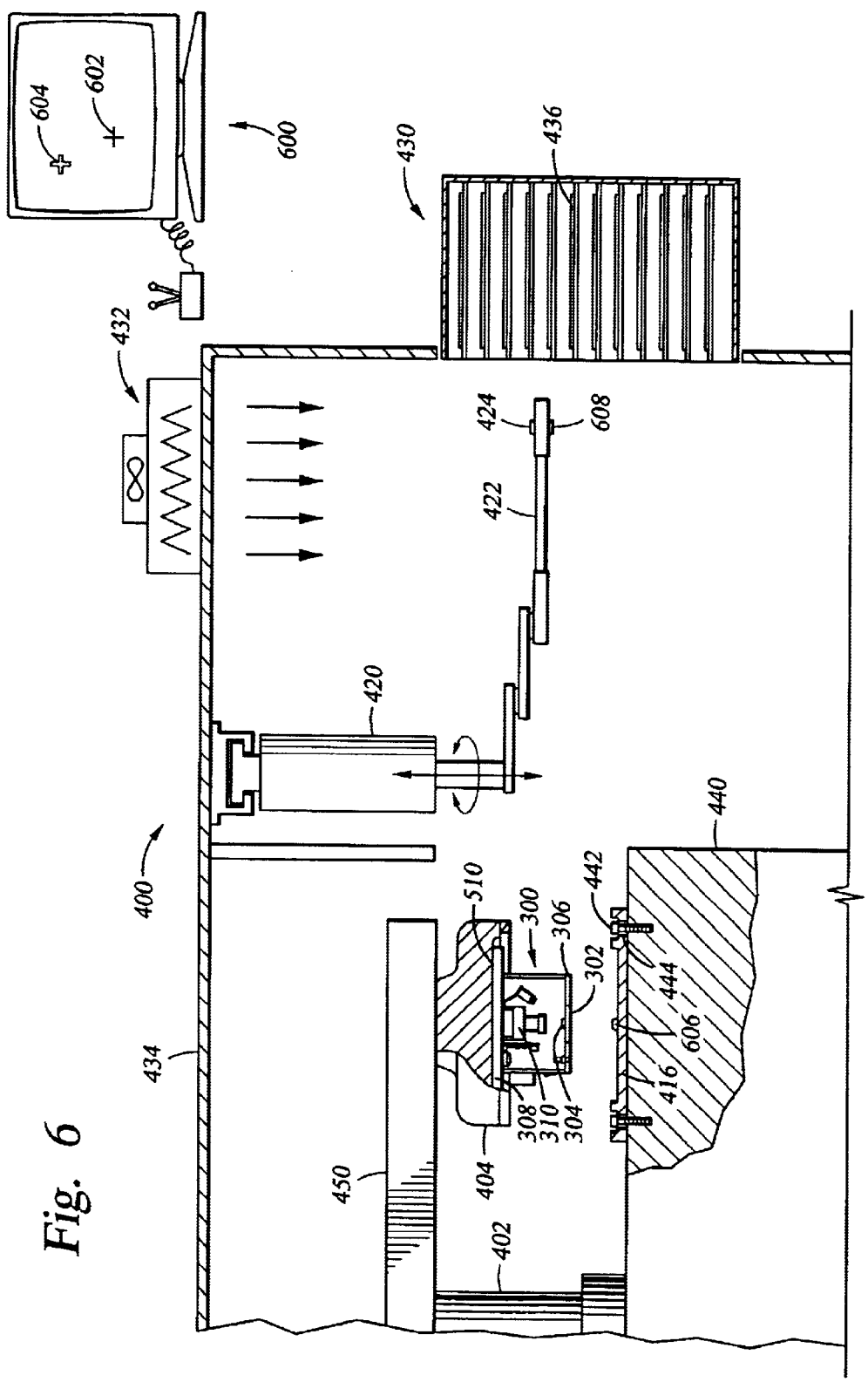

Optionally, as depicted in FIG. 6, a second target 608 may be disposed on the side of the end effector opposite the side on which the first target 424 is disposed. Thus, when using calibration tools simultaneously disposed in different locations that require the target to be disposed on opposing sides of the end effector 422, the alignment processes between various components coupled to the system can be quickly accomplished without having to stop and move the target. As such, the relative positions between the polishing head, load cup and end effector may be determined quickly and with fewer steps.

The other embodiments of a calibration tool may be utilized in other locations on the polishing system. For example, a calibration tool similar to the tool 300 described above may be disposed in the load cup and utilized to align the polishing head or robot.

Although various embodiments which incorporate the teachings of the present invention have been shown and described in detail herein, those skilled in the art can readily devise many other varied embodiments that still incorporate these teachings.

What is claimed is:

1. Apparatus for determining a position of an object comprising:
   a locating plate;
   a window disposed in the locating plate, the window having an indicia disposed thereon;
   a camera positioned to view the indicia through the window;
   a monitor that displays an image viewed by the camera;
   a transmitter coupled to the camera; and
   a receiver coupled to the monitor, the receiver adapted to receive a signal broadcast by the transmitter.

2. The apparatus of claim 1, wherein the indicia is a circle or a cross.

3. The apparatus of claim 1 further comprising a sensor coupled to the locating plate.

4. The apparatus of claim 3, wherein the sensor is a limit switch or proximity sensor.

5. The apparatus of claim 3 further comprising an indicator that responds to a signal from the sensor.

6. The apparatus of claim 5, wherein the indicator is an audible alarm, a light, a communication or a text message.

7. The apparatus of claim 1 further comprising a target disposed on the object.

8. The apparatus of claim 7, wherein the target is permanently affixed to the object.

9. The apparatus of claim 7 further comprising a removable sheath disposed on the object and the target is disposed on the sheath.

10. The apparatus of claim 7, wherein the target further comprises a first target on a first side of the object and a second target on a second side of the object.

11. The apparatus of claim 1 wherein the window comprises polycarbonate.

12. The apparatus of claim 1 further comprising a housing mounted to the locating plate, the camera mounted to a portion of the housing opposite the locating plate.

13. The apparatus of claim 1 further comprising a light adapted to illuminate the window.

14. The apparatus of claim 3 further comprising:

a power source coupled to the light;

a switch coupled between the light and power source; and a circuit-opening device coupled between the light and power source, the circuit-opening device activated by the switch, the circuit-opening device preventing power flow between the power source and the light after a predetermined period of time.

15. The apparatus of claim 1 further comprising a lens disposed between the camera and the window, the lens having a depth of field selected to include the indicia and the object.

16. The apparatus of claim 1 wherein the locating plate includes a flange adapted to simulate a substrate.

17. The apparatus of claim 16, wherein the flange is adapted to be inserted in a slot in a substrate storage cassette.

18. Apparatus for determining a position of an object comprising:

a locating plate having a flange adapted to simulate a substrate;

a window disposed in the locating plate, the window having an indicia disposed thereon; and a camera positioned to view the indicia through the window.

19. The apparatus of claim 18, wherein the flange is adapted to be inserted in a slot in a substrate storage cassette.

20. The apparatus of claim 18 wherein the window comprises polycarbonate.

21. The apparatus of claim 18 further comprising a housing mounted to the locating plate, the camera mounted to a portion of the housing opposite the locating plate.

22. The apparatus of claim 18 further comprising a light adapted to illuminate the window.

23. The apparatus of claim 22 further comprising:

a power source coupled to the light;

a switch coupled between the light and power source; and a circuit-opening device coupled between the light and power source, the circuit-opening device activated by the switch, the circuit-opening device preventing power flow between the power source and the light after a predetermined period of time.

24. The apparatus of claim 18 further comprising a lens disposed between the camera and the window, the lens having a depth of field selected to include tie indicia and the object.

25. The apparatus of claim 18 further comprising a monitor that displays an image viewed by the camera.

26. The apparatus of claim 18, wherein the indicia is a circle or a cross.

27. The apparatus of claim 18 further comprising a sensor coupled a to the locating plate.

28. The apparatus of claim 27, wherein the sensor is a limit switch or proximity sensor.

29. The apparatus of claim 27 further comprising an indicator that responds to a signal from the sensor.

30. The apparatus of claim 29, wherein the indicator is an audible alarm, a light, a communication or a text message.

31. The apparatus of claim 18 further comprising a target disposed on the object.

32. The apparatus of claim 31, wherein the target is permanently affixed to the object.

33. The apparatus of claim 31 further comprising a removable sheath disposed on the object and the target is disposed on the sheath.

34. The apparatus of claim 31, wherein the target further comprises a first target on a first side of the object and a second target on a second side of the object.

* * * * *

UNITED STATES PATENT AND TRADEMARK OFFICE
CERTIFICATE OF CORRECTION

PATENT NO. : 6,648,730 B1
DATED : November 18, 2003
INVENTOR(S) : Chokshi et al.

It is certified that error appears in the above-identified patent and that said Letters Patent is hereby corrected as shown below:

Column 6,
Line 3, please change "indicia=3" to -- indicia's --.

Column 10,
Line 13, please change "tie" to -- the --.
Line 19, please delete "a".

Signed and Sealed this

Twenty-second Day of June, 2004

JON W. DUDAS
*Acting Director of the United States Patent and Trademark Office*